United States Patent
Booman et al.

(10) Patent No.: US 10,225,022 B2
(45) Date of Patent: Mar. 5, 2019

(54) ELECTRO-OPTIC SENSOR SYSTEM

(71) Applicant: TEKTRONIX, INC., Beaverton, OR (US)

(72) Inventors: Richard A. Booman, Lake Oswego, OR (US); Michael J. Mende, Portland, OR (US); Daniel G. Knierim, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 15/394,670

(22) Filed: Dec. 29, 2016

(65) Prior Publication Data

US 2017/0353248 A1    Dec. 7, 2017

Related U.S. Application Data

(60) Provisional application No. 62/344,984, filed on Jun. 2, 2016.

(51) Int. Cl.
| | |
|---|---|
| *H04B 10/00* | (2013.01) |
| *H04B 10/80* | (2013.01) |
| *H04B 10/532* | (2013.01) |
| *G01R 15/24* | (2006.01) |
| *G01R 29/08* | (2006.01) |
| *G01R 31/308* | (2006.01) |

(52) U.S. Cl.
CPC ......... *H04B 10/801* (2013.01); *G01R 15/241* (2013.01); *G01R 29/0885* (2013.01); *G01R 31/308* (2013.01); *H04B 10/532* (2013.01)

(58) Field of Classification Search
CPC .. H04B 10/50; H04B 10/25; H04B 10/07955; H04B 10/0799; H04B 10/0775; H04B 10/5057; H04B 10/801; H04B 10/532; H04L 1/243; H04L 1/244; G01R 31/308; G01R 29/0885; G01R 15/241
USPC .................................................. 398/79, 116
See application file for complete search history.

(56) References Cited

U.S. PATENT DOCUMENTS 6,906,506 B1    6/2005  Reano
2007/0274628 A1*  11/2007  Hayee ................ H04B 10/6971
                                                      385/24

(Continued)

FOREIGN PATENT DOCUMENTS

DE          3528294 A1    2/1986

OTHER PUBLICATIONS

European Patent Office, Extended European Search Report and Written Opinion for European Patent Application 17174369.3, dated Nov. 6, 2017, 8 pages, European Patent Office, Munich, Germany.

*Primary Examiner* — Don N Vo
(74) *Attorney, Agent, or Firm* — Miller Nash Graham & Dunn; Kevin D. Dothager; Andrew J. Harrington

(57) ABSTRACT

An electro-optical sensor comprises an optical input configured to receive an optical carrier via an upstream fiber. The electro-optical sensor also includes an optical modulator configured to modulate an electrical signal onto the optical carrier to create an optical signal. The electro-optical sensor further includes an optical output configured to transmit the optical signal via a downstream fiber. The electro-optical sensor employs a variation output configured to transmit variation data indicating variation in the received optical carrier to support compensation for corresponding variation in the optical signal.

11 Claims, 11 Drawing Sheets

(56) References Cited

U.S. PATENT DOCUMENTS

| | | | |
|---|---|---|---|
| 2009/0175629 A1* | 7/2009 | Liu | H04B 10/25133 398/147 |
| 2014/0169784 A1* | 6/2014 | Zhou | H04B 10/6164 398/25 |
| 2014/0266285 A1* | 9/2014 | Detofsky | G01R 31/2889 324/756.05 |
| 2015/0381273 A1* | 12/2015 | Gloeckner | H04B 10/40 398/16 |
| 2016/0099851 A1* | 4/2016 | Archambault | H04J 14/0212 398/16 |
| 2016/0119078 A1* | 4/2016 | Kakande | H04J 14/06 398/65 |

* cited by examiner

ELECTRO-OPTIC SENSOR SYSTEM

FIELD OF THE INVENTION

This disclosure is directed to a system and methods for testing optical signals, and, more particularly, to an electro-optical voltage probe and corresponding accessory for use in conjunction with an oscilloscope.

BACKGROUND

Test and measurement systems are designed to receive signals, sample the signals, and display the results. For example, a test and measurement system may be implemented to determine and display characteristics of signals occurring at a device under test (DUT). In some cases, the test and measurement system may be located remotely from the DUT. For example, some DUT signals may be altered by the presence of any electrical system in close proximity to the DUT. In such cases, the test and measurement system may be located remotely from the DUT to support electrical isolation of the DUT, which results in increased measurement accuracy. However, the signals from the DUT may still traverse cabling to reach the remotely located test and measurement system. The signals may be altered during transition between the DUT and the test and measurement system, which may reduce the accuracy of the displayed results at the test and measurement system.

Aspects of the invention address these and other issues.

DETAILED DESCRIPTION

Figure 1:
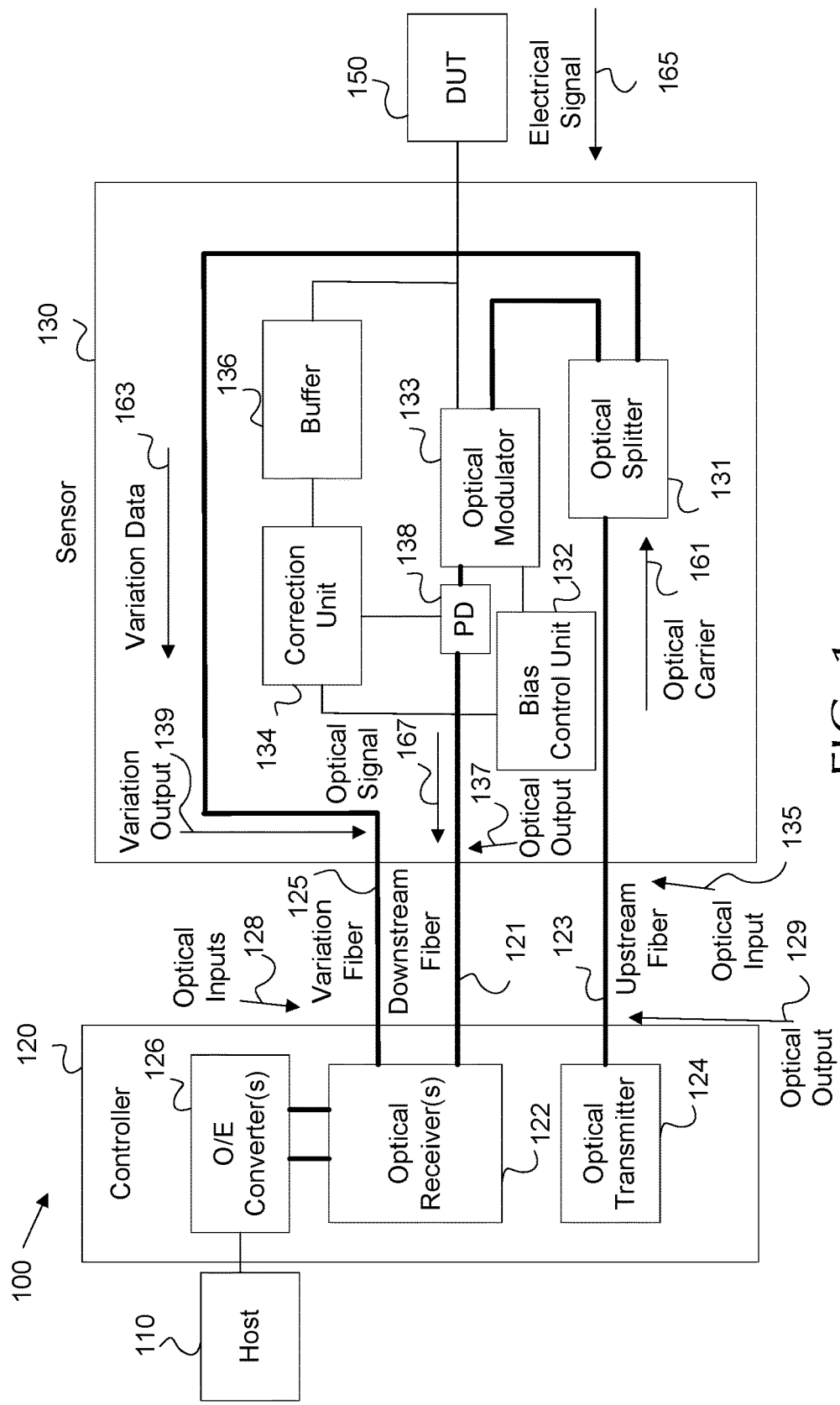
FIG. 1 is a block diagram of an aspect of a test and measurement system for determining optical carrier variation between a host and a DUT.

The aspects of the present disclosure are susceptible to various modifications and alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific aspects described herein unless expressly limited. As such, the present disclosure is intended to cover all modifications, equivalents, and alternatives of the described aspects in light of the attached drawings and claims.

References in the specification to aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

A remote electro-optical sensor may be coupled to the DUT and coupled to a controller via electrical cables and/or optical fiber. To support electrical isolation, an optical carrier may be transmitted from the controller to the electro-optical sensor over an upstream fiber. The electro-optical sensor may then modulate data from the DUT onto the optical carrier and forward the resulting optical signal back to the controller via a downstream fiber for conversion into an electrical signal for processing and display by a host. Such a system promotes electrical isolation of the DUT and reduces the amount of power employed by the remote electro-optical sensor. However, bends in the upstream fiber and/or other ambient mechanical motion may cause some optical loss and hence vary the intensity of the optical carrier received by the electro-optical sensor. Such variation may then impact the resulting optical signal received by the controller. Further, the electro-optical sensor may employ an optical modulator to perform data modulation onto the optical carrier. Some optical modulators are polarization sensitive. Bends in the optical fiber and/or other mechanical motion may also cause variations in the polarization of the optical carrier. Such improperly polarized portions of the carrier may be blocked by the optical modulator, resulting in variation in the optical intensity of the carrier at the optical modulator and variation in the optical signal.

Disclosed herein is a test and measurement system configured to compensate for optical carrier variation between a DUT and a host, such as an oscilloscope. The test and measurement system may be configured to determine variation of the intensity of the optical carrier received by the electro-optical sensor and perform compensation. The test and measurement system may then account for loss of optical carrier intensity due to optical loss and/or polarization shift occurring over intervening fiber(s). Optical loss occurring on the upstream fiber can be determined by employing multiple mechanisms. For example, an optical splitter may be positioned between the sensor's optical input and optical modulator. An un-modulated portion of the optical carrier may then be forwarded back to the controller as variation data. In some aspects, the electro-optical sensor may also contain an optical to electrical (O/E) converter to convert the variation data into an electrical signal prior to transmission. In yet another aspect, the variation data may be employed by a bias control unit in the sensor to compensate for the variation at the optical modulator as part of a feedback loop. In yet another embodiment, the optical modulator may be implemented as a directional coupler with two outputs for carrying the optical signal and the optical signal's complement, respectively, with the variation data included in both signals. In yet another embodiment, the sensor may include a radio frequency (RF) signal generator configured to inject a high frequency reference signal of known value into the optical signal. The host/controller may separate the high frequency reference signal from the transmission data and employ the alterations in the high frequency reference signal to determine variations occurring to the optical carrier. Once the variation is determined, various mechanisms may be employed to pre-compensate or post compensate for the variation. For example, a feedback loop may pre-compensate for variation by boosting and/or reducing power to an optical transmitter in the controller. In another aspect, a control modulator at the electro-optical sensor may be employed to adjust the optical carrier prior to receipt by the optical modulator. In other aspects, the controller and/or host can post compensate for the variation by dividing sensor output by sensor input to remove variation and/or correcting for changes in optical carrier offset shift.

FIG. 1 is a block diagram of an aspect of a test and measurement system 100 for determining optical carrier 161 variation between a host 110 and a DUT 150. System 100 includes a host 110 for measuring an electrical signal 165 from a DUT 150. The DUT 150 may be positioned remotely from host 110 for various reasons. For example, the DUT 150 may be positioned in a hazardous environment (e.g. inside a high temperature chamber) or may be susceptible to electrical interference and require isolation from electrical sources such as host 110. The signal may be communicated by an electro-optical sensor 130 located in close proximity to the DUT 150 and a controller 120 located in close proximity to the host 110. The electro-optical sensor 130 may modulate the electrical signal 165 from the DUT 150 onto an optical carrier 161 for transmission to the host 110 via the controller 120. The optical carrier 161 may be generated by an optical transmitter 124, which may require a relatively significant power budget. An electro-optical sensor 130 may be located away from a significant power source. For example, the electro-optical sensor 130 may be battery powered due to unavailability of a power connection at the DUT 150 or a power connection may be omitted from the electro-optical sensor 130 to support electrical isolation for the DUT 150. Accordingly, the optical transmitter 124 is positioned in the controller 120 and the optical carrier 161 is forwarded upstream from the controller 120 to the electro-optical sensor 130 for modulation and then returned downstream as an optical signal 167 for communication to the host 110 via the controller 120. As noted above, transmission of an optical carrier 161/optical signal 167 between the controller 120 and the sensor 130 may result in a loss of optical intensity which may be erroneously attributed to changes in the electrical signal 165 from the DUT 150. Accordingly, the electro-optical sensor 130 is configured to capture and transmit variation data 163 indicating variations in intensity of the received optical carrier 161. Such variation data 167 may then be employed to compensate for such variations and hence provide a more accurate display of electrical signal 165 from the DUT 150 at the host 110. It should be noted that, for purposes of clarity, optical connections are depicted in bold lines, while electrical connections are depicted as thin lines.

The controller 120 may be any device configured to transmit an optical carrier 161, receive a corresponding optical signal 167, and forward transmission data from the optical signal 167 to the host 110 for analysis and/or display to a user. The controller 120 includes an optical transmitter 124 coupled to an optical output 129. The optical transmitter 124 may be any device configured to generate an optical carrier 161. For example, the optical transmitter 125 may be a laser/laser diode that emits polarized light. The optical output 129 is any port capable of coupling an upstream fiber 123 to the optical transmitter 124 to support communication of the optical carrier 161 from the controller 120 to the electro-optical sensor 130. The upstream fiber 123 can be any coupling medium capable for communicating the optical carrier 161 to the electro-optical sensor 130.

The electro-optical sensor 130 receives the optical carrier 161 from the controller 120 over the upstream fiber 123. The electro-optical sensor 130 includes an optical input 135 configured to receive the optical carrier 161 via the upstream fiber 123. The optical input 135 may be any port capable of coupling the upstream fiber 123 to an optical channel in the electro-optical sensor 130. As noted above, changes in the upstream fiber 123 may affect the intensity of the optical carrier 161 received at the electro-optical sensor 130. For example, mechanical motion applied to the upstream fiber 123, such as bending of the fiber 123, bouncing the fiber 123, and/or changing the ambient temperature of the fiber 123 can vary the intensity and/or polarization of the optical carrier 161. Accordingly, the electro-optical sensor 130 includes an optical splitter 131 positioned between optical input 135 and an optical modulator 133. The optical splitter 131 is configured to forward an un-modulated portion of the received optical carrier 161 to a variation output 139 as variation data 163. The remaining portion of the optical carrier 161 is forwarded from the optical splitter 131 to an optical modulator 133 for modulation as discussed below. The variation data 163 may indicate any variation in the received optical carrier 161 due to the upstream fiber 123 and not the electrical signal 165 from the DUT 150. The variation output 139 is any port capable of coupling a variation fiber 125 to an optical channel of the electro-optical sensor 130 to support communication of the variation data 163 from the electro-optical sensor 130 back to the controller 120. Accordingly, the variation output 139 is configured to transmit variation data 163 indicating variation in the received optical carrier 161 to support compensation for corresponding variation in the optical signal 167.

The DUT 150 is any device configured to transmit an electrical signal 165 for testing purposes. The electrical signal 165 is forwarded to the optical modulator 133 in the electro-optical sensor 130. The optical modulator 133 is configured to modulate the optical carrier 161 based on the electrical signal 165 to create an optical signal 167. The optical signal 167 contains substantially the same information as the electrical signal 165 as effected by any variation in the optical carrier 161. The optical modulator 133 may be any device that can modulate an electrical signal 165 onto on optical carrier 161, such as a mach-zehnder modulator, mach-zehnder interferometer, etc.

The electro-optical sensor 130 may also include a buffer 136, a corrections unit 134, a photodetector (PD) 138, and a bias control unit 132. The buffer 136 is any circuit configured to temporarily store (e.g. buffer) the electrical signal 165 for use by the correction unit 134. The PD 138 is configured to detect the optical output of the optical modulator 133 and feed such output into the corrections unit 134. The correction unit 134 then compares the electrical signal 165 to the optical signal 167 and directs the bias control unit 132 to adjust the optical modulator 133 to account for modulation error. The bias control unit 132 is any circuit capable of altering the electrical characteristics of the optical modulator 133 to adjust the modulation of the electrical signal 165 onto the optical carrier 161 (e.g. to control for error).

The electro-optical sensor 130 also include an optical output 137 configured to transmit the optical signal via a downstream fiber 121. The optical output 137 is any port capable of coupling a downstream fiber 121 to an optical channel of the electro-optical sensor 130 to support communication of the optical signal 167 from the electro-optical sensor 130 back to the controller 120. Accordingly, the downstream fiber 121 and variation fiber 125 may be substantially similar to the upstream fiber 123, but may carry the optical signal 167 and the variation data 163, respectively, to the controller 120.

The controller receives the downstream fiber 121 and variation fiber 125 at optical inputs 128. The optical inputs 128 are communications ports that conduct the variation data 163 and the optical signal 167 to one or more optical receivers 122. The optical receivers 122 are configured to forward the optical signal 167 and the variation data 163, respectively, to at least one optical to electrical (O/E) converter 126. The O/E converter 126 is any device configured to convert an optical signal into an electrical signal, for example by employing PDs. As such, the O/E converter 126 converts the optical signal 167 and the variation data 163 into the electrical domain for use by the controller 120 and/or the host 110. By employing the variation data 163, the controller 120 and/or host 110 can pre-compensate for variations of intensity of the optical carrier 161 by adjusting power and/or optical intensity of the optical transmitter 124 in a feedback loop. Further, the controller 120 and/or host 110 can adjust transmission data sampled from the optical signal 167 to account for such variations in the optical carrier 161. Such pre-compensation and post compensation techniques are discussed more fully below.

The transmission data from the optical signal 167 and/or variation data 163 is output from the O/E converter 126 to the host 110 for sampling and/or display to a user. The host 110 may be any test and measurement system configured to accept digital or analog signals from a DUT 150 and store and/or display data related to such signals to a user. For example, the host 110 may be an oscilloscope configured to sample digital and/or analog signals, store signal samples in memory, and/or graphically display waveforms depicting the signals on a graticule or other display device. The host 110 may also include a general purpose computer for applying software based analysis tools to the sampled signals.

It should be noted that optical paths may employ bends instead of right angles to allow for propagation of optical signals. As such, the optical paths of FIG. 1 are depicted schematically for clarity of discussion, but in implementation would include appropriate bends and alignment between optical components.

It should also be noted that the aspects shown in FIG. 1 are amenable to various modifications. For example, the optical modulator 133 may be polarization sensitive. Polarized light is light that vibrates in a single plane. The optical carrier 161 may be polarized upon leaving the optical transmitter 124. However, the optical carrier 161 may become partly depolarized when traversing upstream fiber 123. Such depolarized light may be blocked by a polarization sensitive optical modulator 133 and lost, which may result in a loss of optical intensity. Accordingly, loss of polarization may be treated as a source of optical carrier 161 variation for polarization sensitive systems. In such a case, the optical splitter 131 can be configured to split the optical carrier 161 based on polarization. For example, the optical splitter 131 may be configured to forward portions of the optical carrier 161 with polarization incompatible to the optical modulator 133 as the variation data 163 (e.g. the un-modulated portion of the received optical carrier 161). By employing this approach, the optical splitter 131 only forwards depolarized light that would have otherwise been lost as the variation data 163. This approach conserves the useful light for use in the optical signal 167. Such an approach is particularly useful when the primary source of optical carrier 161 loss is polarization based variation. As a specific example, the optical splitter 131 may be implemented as a polarizing beam splitter with a primary axis aligned with the optical modulator 133 and a secondary axis aligned with the optical channel coupled to the variation output. Such an approach may also be employed with systems 200 and 300 as discussed below.

Figure 2:
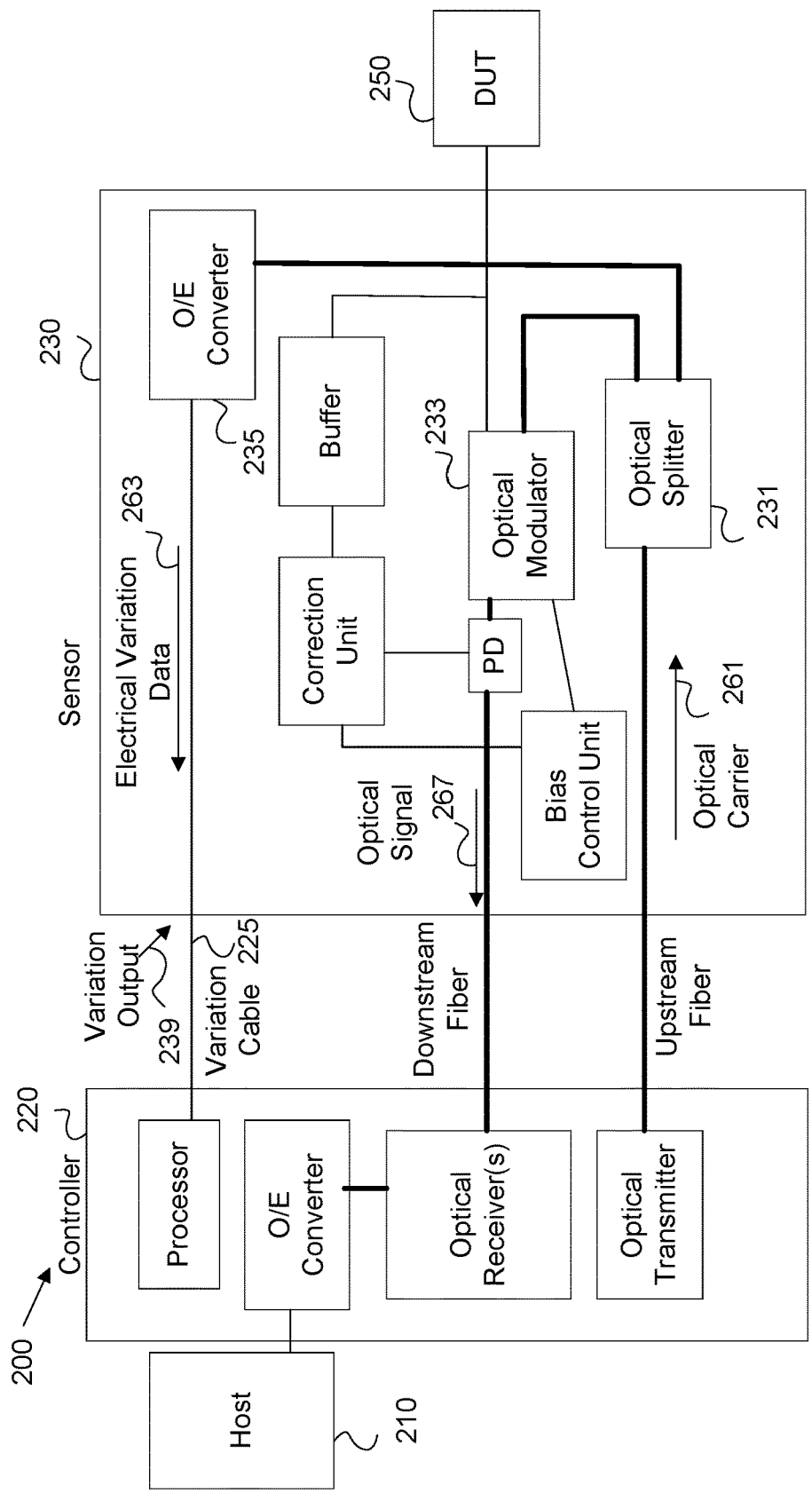
FIG. 2 is a block diagram of another aspect of a test and measurement system for determining optical carrier variation between a host and a DUT.

FIG. 2 is a block diagram of another aspect of a test and measurement system 200 for determining optical carrier 261 variation between a host 210 and a DUT 250. System 200 is substantially similar to system 100, with modifications as described below. Specifically, system 200 employs a host 210, a controller 220, an electro-optical sensor 230, and a DUT 250, which are substantially similar to the host 110, the controller 120, the electro-optical sensor 130, and the DUT 150, respectively, and configured as shown. Further, system 200 employs an optical splitter 231, an optical modulator 233, a variation output 239, an optical carrier 261, and an optical signal 267, which are substantially similar to the optical splitter 131, the optical modulator 133, the variation output 139, the optical carrier 161, and the optical signal 167, respectively.

The optical carrier 261 is received at an optical splitter 231 as in system 100. The electro-optical sensor 230 comprises an O/E converter 235 that is substantially similar to O/E converter 126. The O/E converter 235 is positioned between the optical splitter 231 and the variation output 239. The un-modulated portion of the received optical carrier 261 is forwarded from the optical splitter 231 to the O/E converter 235 as optical variation data. The O/E converter 235 converts the un-modulated portion of the optical carrier 261 into electrical variation data 263. The electrical variation data 263 is then forwarded across an electrical variation cable 225 to the controller 220 and/or host 210 for pre-compensation and/or post compensation for optical carrier 261 variation, depending on the embodiment. The electrical variation cable 225 may be any electrically conductive medium capable of transmitting an electrical signal between the electro-optical sensor 230 and the controller 220. The optical splitter 231 forwards the remainder of the optical carrier 261 to the optical modulator 233 for modulation into an optical signal 267 in a manner substantially similar to system 100. The electrical variation data may also be digitized and communicated to the controller 220 as digital data, which could be transmitted from the sensor 220 to the controller 220 through an optical data link over a separate downstream fiber.

Figure 3:
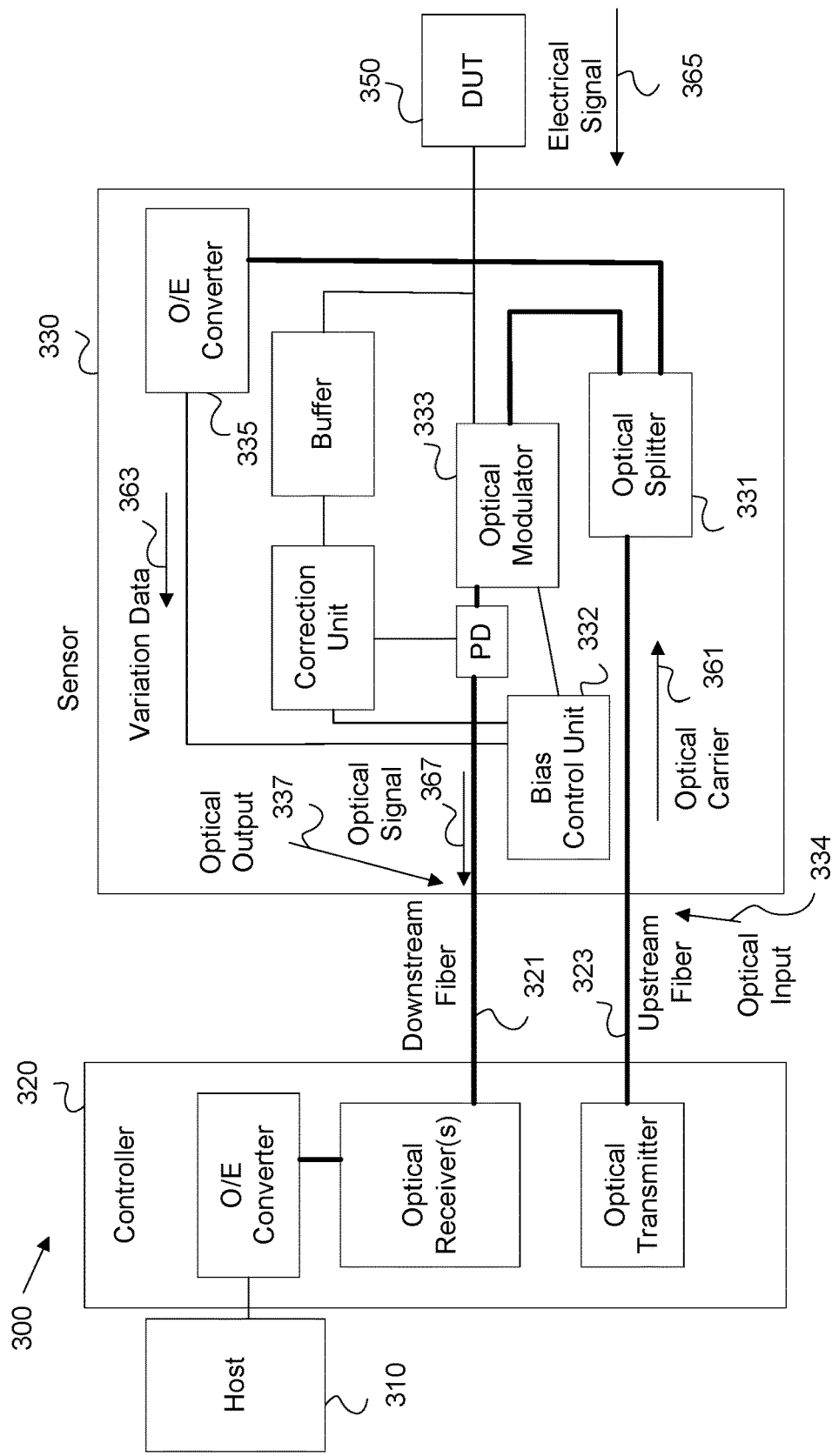
FIG. 3 is a block diagram of yet another aspect of a test and measurement system for determining optical carrier variation between a host and a DUT.

FIG. 3 is a block diagram of yet another aspect of a test and measurement system 300 for determining optical carrier 361 variation between a host 310 and a DUT 350. System 300 is substantially similar to systems 100 and 200, but is modified to compensate for optical carrier 361 variation in an electro-optical sensor 330. System 300 includes a host 310, a controller 320, and a DUT 350, which are substantially similar to the host 110, the controller 120, and the DUT 150, respectively. System 300 also includes an electro-optical sensor 330, which is similar to electro-optical sensor 130. The electro-optical sensor 330 is coupled to the controller 320 with an upstream fiber 323 and a downstream fiber 321, which are substantially similar to upstream fiber 123 and downstream fiber 121, respectively, but no variation fiber. The electro-optical sensor includes an optical splitter 331, an optical modulator 333, an O/E converter 335, a bias control unit 332, an optical input 334, and an optical output 337, which are similar to the optical splitter 131, the optical modulator 133, the O/E converter 235, the bias control unit 132, the optical input 135, and the optical output 137, respectively. The electro-optical sensor 330 receives an optical carrier 361 and an electrical signal 365 and generates an optical signal 367 and variation data 363, which are similar to the optical carrier 161, the electrical signal 165, the optical signal 167, and the electrical variation data 263, respectively.

The electro-optical sensor 330 receives the optical carrier 361 at the optical input 334 from the upstream fiber 323. The electro-optical sensor 330 includes the optical splitter 331, which is positioned between the optical input 334 and the optical modulator 333 as in system 100. The optical splitter 331 is configured to forward a portion of the optical carrier 361 to the optical modulator 333 and another portion of the optical carrier 361 toward the O/E converter 335 as variation data 363. The optical modulator 333 is configured to modulate the electrical signal 365 from the DUT 350 onto the optical carrier 361 to create the optical signal 367. The optical signal 367 is then transmitted from the optical output 337 via the downstream fiber 321.

Unlike systems 100 and 200, system 300 does not forward the variation data 363 to the controller 320 or host 310. The O/E converter 335 converts the variation data 363 into the electrical variation data for use by the bias control unit 332. The variation data 363 is then forwarded to the bias control unit 332. The bias control unit 332 employs the variation data 363 to bias the optical modulator 333 to compensate for variation in the received optical carrier 361 to mitigate corresponding variation in the optical signal 367 (e.g. as part of a feedback loop). Accordingly, bias control unit 332 acts as a compensation component in system 300.

As with systems 100 and 200, the optical modulator 333 may be polarization sensitive. In some aspects, the optical splitter 331 is configured to forward portions of the optical carrier 361 with polarization incompatible with the optical modulator 333 as the variation data 363. For example, the optical splitter 331 may be a polarizing beam splitter with a primary axis aligned with the optical modulator 333 and a secondary axis aligned with the O/E converter 335.

Figure 4:
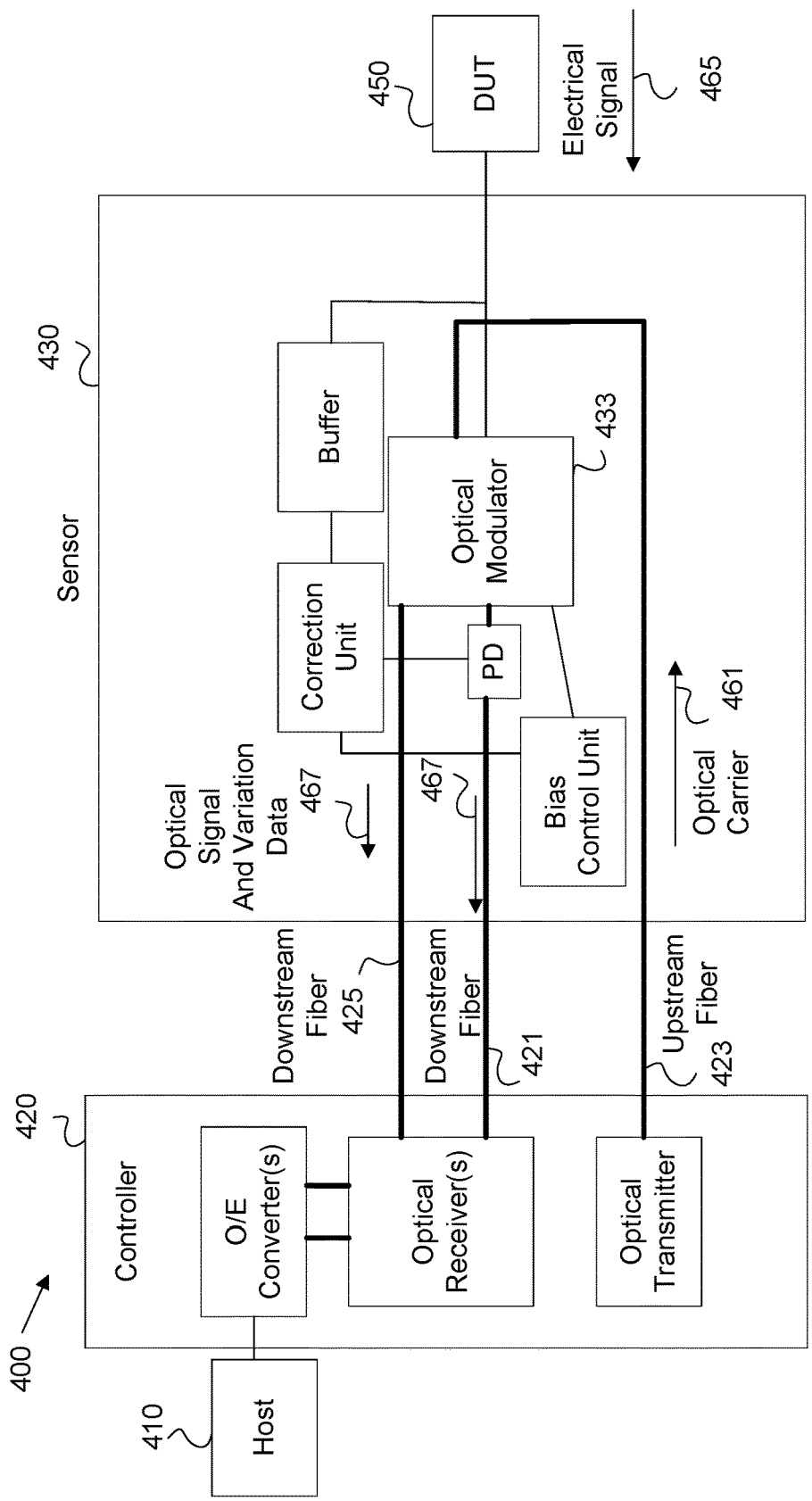
FIG. 4 is a block diagram of yet another aspect of a test and measurement system for determining optical carrier variation between a host and a DUT.

FIG. 4 is a block diagram of yet another aspect of a test and measurement system 400 for determining optical carrier 461 variation between a host 410 and a DUT 450. System 400 is substantially similar to system 100, but is modified to include the optical splitter in an optical modulator 433. System 400 includes a host 410, a controller 420, and a DUT 450, which are substantially similar to the host 110, the controller 120, and the DUT 150, respectively. System 400 also includes an electro-optical sensor 430, which is similar to electro-optical sensor 130 but does not include a separate optical splitter. The electro-optical sensor 430 includes an optical modulator 433 configured to receive an optical carrier 461 from an upstream fiber 423 and an electrical signal 465, which are similar to the optical modulator 133, the optical carrier 161, the upstream fiber 123, and the electrical signal 165, respectively. The electro-optical sensor 430 is also configured to couple to a pair of downstream fibers 421 and 425, which are substantially similar to the downstream fiber 121 and the variation fiber 125, respectively.

The optical modulator 433 is implemented as a directional coupler with one input and two outputs coupled to the downstream fibers 421 and 425. The optical modulator 433 splits the optical carrier into two paths and modulates the electrical signal 465 onto both paths. Each of the paths are then coupled, and the resulting optical signals 467 output onto the downstream fibers 421 and 425. Each of the optical signals 467 contain variation data, which can be employed to determine variation in the optical carrier 461. The two outputs both track the changes in optical intensity. However, the optical carrier 461 causes these outputs to vary as described in equations 1-2 below:

$$Out_1 = \tfrac{1}{2} I_{in} * (1 + V_{in} * \text{Gain})$$

$$Out_2 = \tfrac{1}{2} I_{in} * (1 - V_{in} * \text{Gain}) \qquad \text{Equations 1-2}$$

where $Out_1$ is the optical signal output of the first output, $Out_2$ is the optical signal output on the second output, $I_{in}$ is the input intensity of the optical carrier 461, $V_{in}$ is the voltage applied by the electrical signal 465, and gain is the signal gain applied by the optical modulator 433.

At the controller 420, both of these optical signals from downstream fibers 421 and 425 may be detected and converted to a voltage as approximately described in equations 3-4 below:

$$VOut_1 = R * \tfrac{1}{2} I_{in} * (1 + V_{in} * \text{Gain})$$

$$VOut_2 = R * \tfrac{1}{2} I_{in} * (1 - V_{in} * \text{Gain}) \qquad \text{Equations 3-4}$$

where VOut1 is the voltage output resulting from the first optical signal 467 when converted to the electrical domain, VOut2 is the voltage output resulting from the second optical signal 467 when converted to the electrical domain, R is the resistance of the O/E converter, and all other variables are as discussed with respect to Equations 1-2. Adding the signals together results in equation 5, subtracting the two signals results in equation 6, and dividing difference by the sum results in equation 7:

$$VOut_1 + VOut_2 = R * I_{in}$$

$$VOut_1 - VOut_2 = R * I_{in} * (V_{in} * \text{Gain})$$

$$(VOut_1 - VOut_2)/(VOut_1 + VOut_2) = (R * I_{in}) * (V_{in} * \text{Gain})) / (R * I_{in}) = (V_{in} * \text{Gain}) \qquad \text{Equations 5-7}$$

where all variables are as discussed with respect to equations 1-4. As can be seen by reviewing equations 5-7 dividing the difference of the signals by the sum of the signals eliminates $I_{in}$, which corresponds to the input intensity of the optical carrier 461. As such, the two outputs of the optical modulator 433 can be employed to remove the results of variations of intensity of the optical carrier 461 on the optical signal 467 transmission data.

Figure 5:
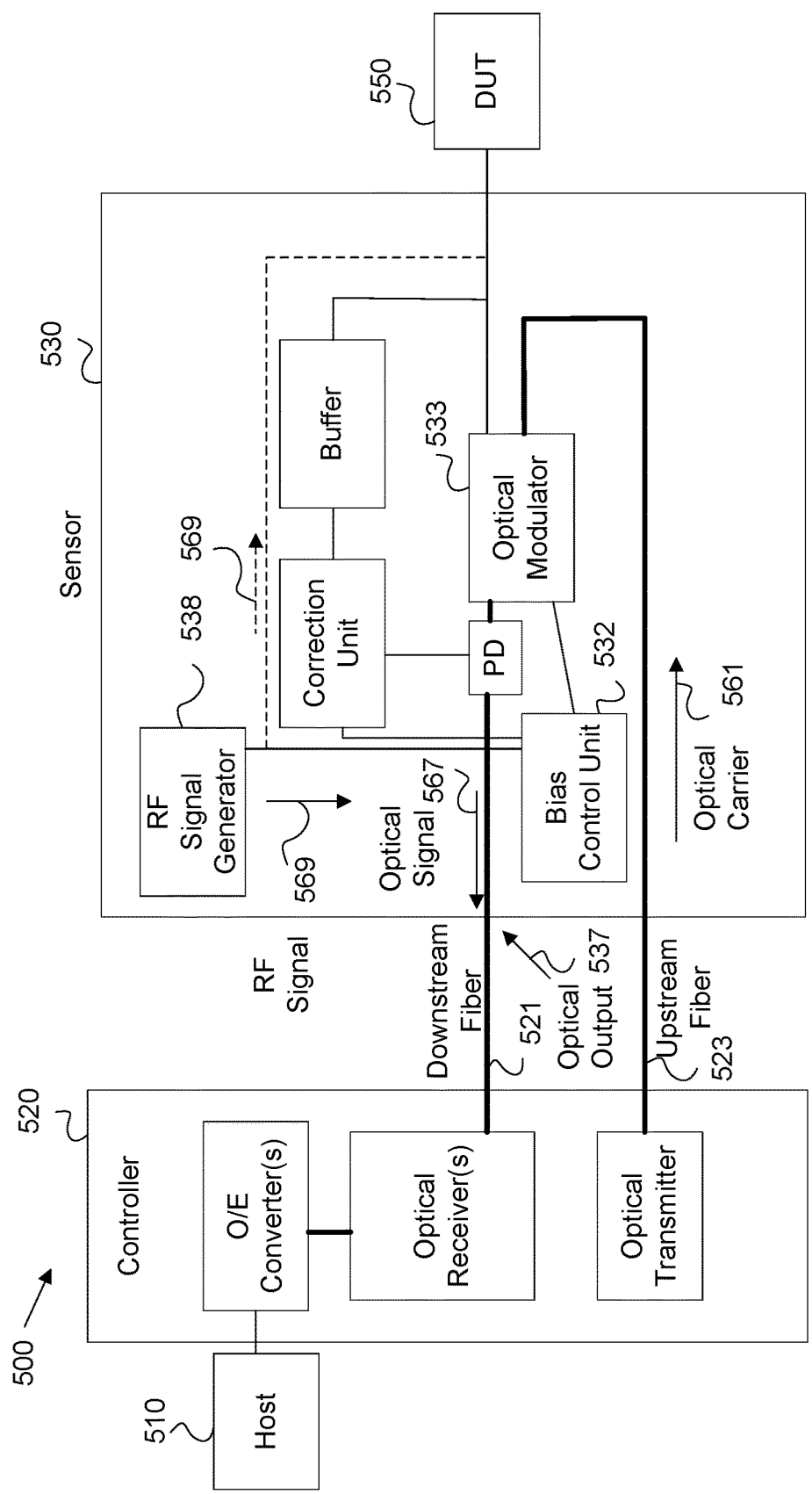
FIG. 5 is a block diagram of yet another aspect of a test and measurement system for determining optical carrier variation between a host and a DUT.

FIG. 5 is a block diagram of yet another aspect of a test and measurement system 500 for determining optical carrier 561 variation between a host 510 and a DUT 550. System 500 is substantially similar to systems 100, but is modified to employ an RF signal 569 as variation data. System 500 includes a host 510, a controller 520, and a DUT 550, which are substantially similar to the host 110, the controller 120, and the DUT 150, respectively. System 500 also includes an electro-optical sensor 530, which is similar to electro-optical sensor 130. The electro-optical sensor 530 includes an optical modulator 533, a bias control unit 532, and an optical output 537, which are similar to the optical modulator 133, the bias control unit 132, and the optical output 137, respectively. The electro-optical sensor 530 employs an optical carrier 561, an optical signal 567, a downstream fiber 521, and an upstream fiber 523, which are substantially similar to the optical carrier 161, the optical signal 167, the downstream fiber 121, and the upstream fiber 123, respectively.

The electro-optical sensor 530 also includes an RF generator 538. The RF generator 538 is any circuit configured to generate an RF signal 569 for modulation onto the optical carrier 561 along with the electrical signal. The RF signal 569 is any signal of a known frequency. The RF signal 569 operates at a different frequency than the electrical signal. The bias control unit 532 is configured to receive the RF signal 569 and cause the optical modulator 533 to modulate the RF signal 569 onto the optical carrier 561. The RF signal 569 could also be injected in the signal path between the DUT 550 and the optical modulator 533 using, for example, a frequency dependent splitter/combiner, depicted in FIG. 5 as an optional dashed line. The optical signal 567 is sent over the downstream fiber 521 to the controller 520. The controller 520 and/or host 510 are aware of the frequency of the RF signal 569. Hence any changes in the RF signal 569 from the known frequency are due to variations caused by both the upstream and the downstream fiber 521. As such, the optical output 537 may also act as a variation output coupled to both the upstream 523 and the downstream fiber 521. Further, the RF signal 569 may act as variation data passing across both the upstream 523 and the downstream fiber 521.

Figure 6:
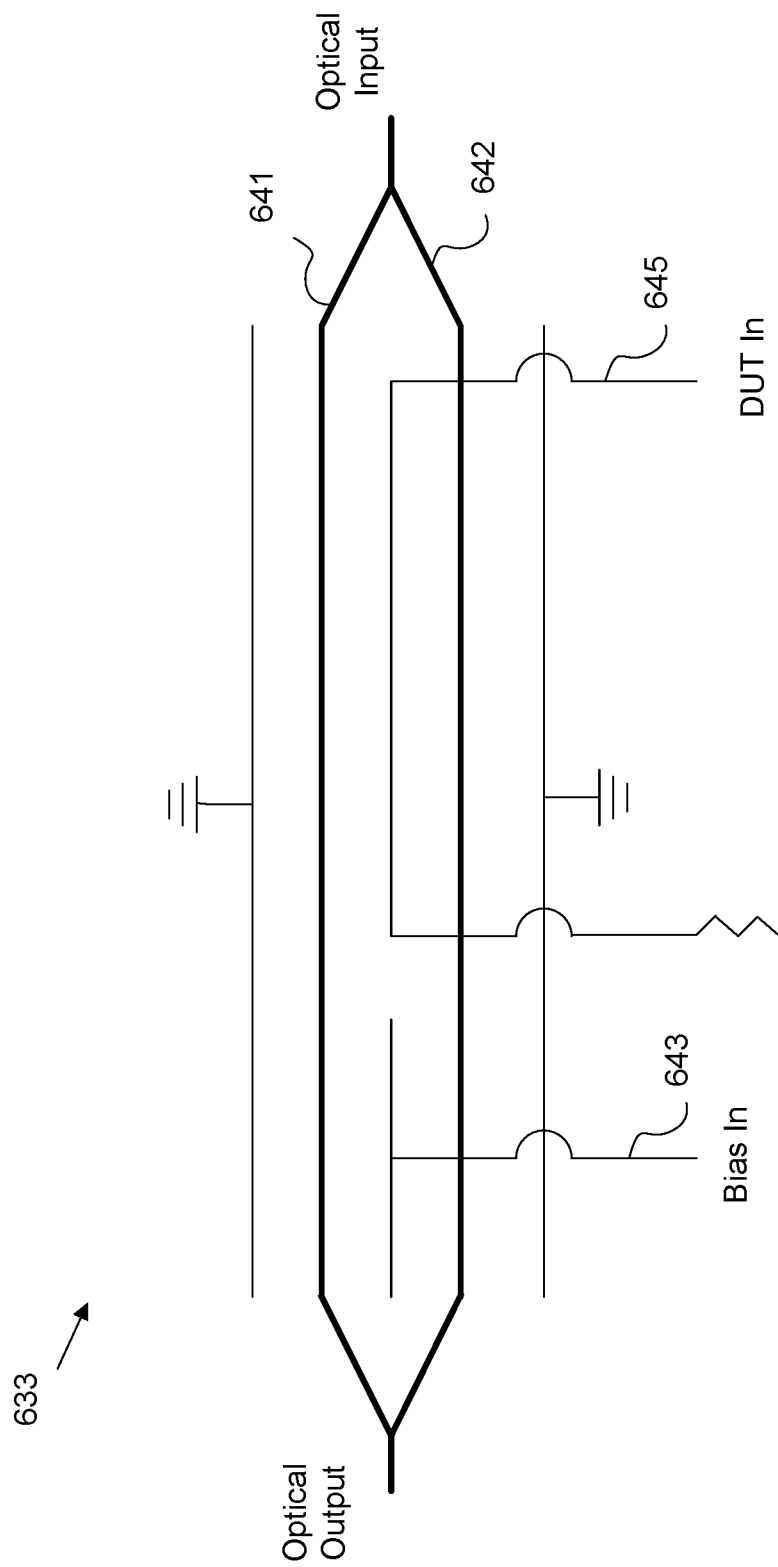
FIG. 6 illustrates an example optical modulator employed in an electro-optical sensor.

FIG. 6 illustrates an example optical modulator 633 employed in an electro-optical sensor, such as an optical modulator 133, 233, 333, and/or 533 in an electro-optical sensor 130, 230, 330, and/or 530. For example, the optical modulator 633 maybe implemented as a mach-zehnder modulator and/or mach-zehnder interferometer. The optical modulator 633 includes an upper arm 641 and a lower arm 642, are waveguides configured to conduct light. Light from an optical source (e.g. an optical carrier) is split between the upper arm 641 and the lower arm 642. The optical modulator 633 receives a DUT input 645 carrying an electrical signal from a DUT and a bias 643 carrying a signal from a bias control unit. The electrical signals from the bias 643 and the DUT input 645 change the electrical characteristics of the optical modulator 633, causing the optical modulator 633 to alter the phase of light passing through the upper arm 641 and lower arm 642. Accordingly, the signal from the DUT input 645 causes changes in the light from the optical source resulting in an optical signal. Further, changes in the electrical signal from the bias 643 can modify the optical signal to correct for errors. The resulting light in the upper arm 641 and the lower arm 642 is recombined as a modulated optical signal.

Figure 7:
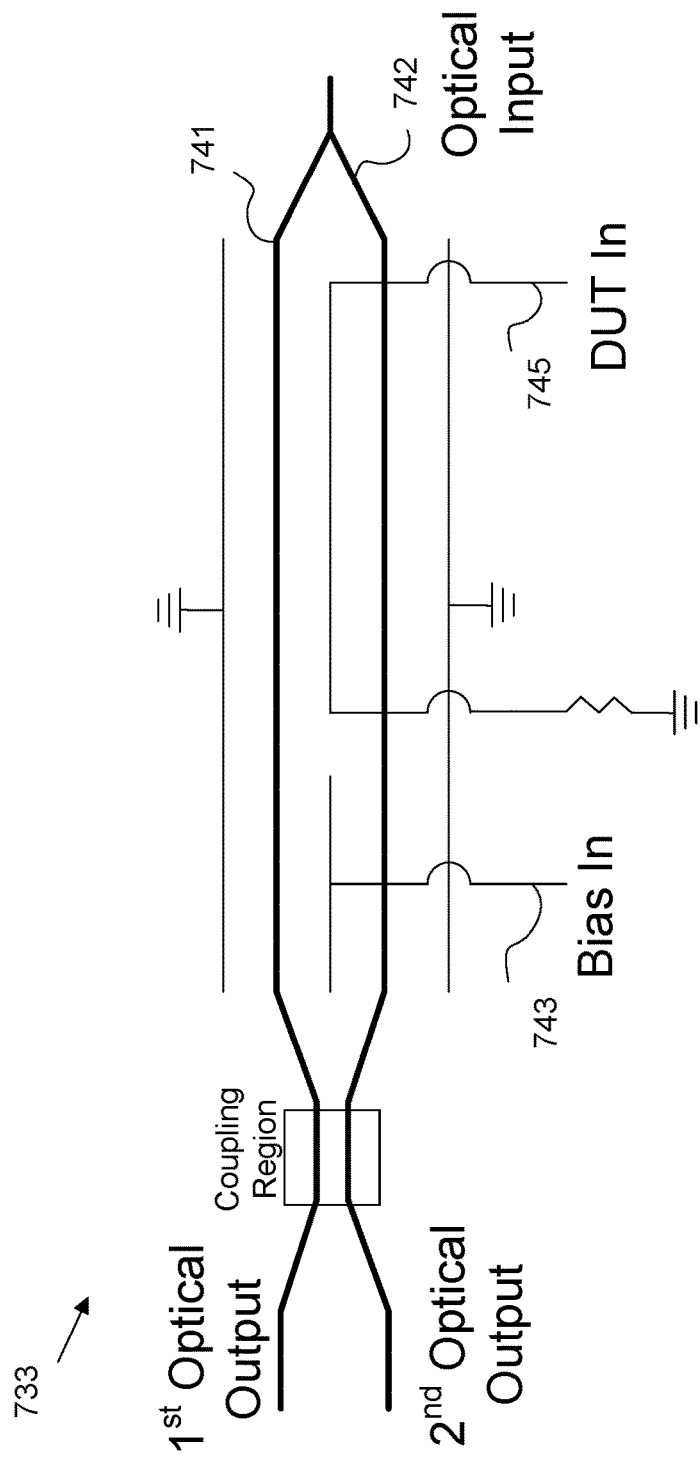
FIG. 7 illustrates another example optical modulator employed in an electro-optical sensor.

FIG. 7 illustrates another example optical modulator 733 employed in an electro-optical sensor, such as an optical modulator 433 in an electro-optical sensor 430. For example, the optical modulator 733 maybe implemented as a directional coupler. Optical modulator 733 includes a DUT input 745, a bias 743, an upper arm 741, and a lower arm 742, which are similar to the optical modulator 633, the DUT input 645, the bias 643, the upper arm 641, and the lower arm 642, respectively. The signal applied to the upper arm 741 and the lower arm 742, via the DUT input 745 and the bias 743, is recombined in the coupling region. The fraction of the input power coupled into the first optical output and the second optical output depends on the relative phase of the light in the upper arm 741 and the lower arm 742, respectively. Such fraction is determined by the signals applied to the DUT input 745 and the bias 743 input. Accordingly, the light output in the first optical output and the $2^{nd}$ optical output both vary with variations in the optical input. Hence, both optical outputs contain the optical signal and the variation data. It should be noted that optical modulator 733 acts as both an optical modulator and an optical splitter.

Figure 8:
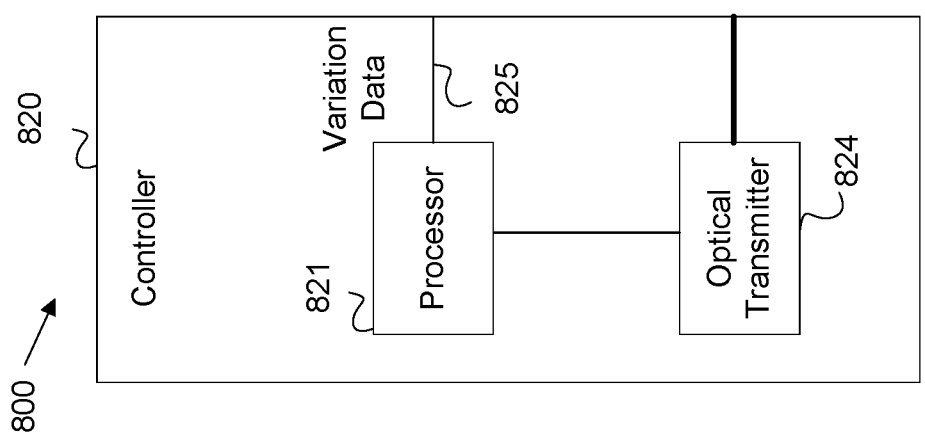
FIG. 8 is a block diagram of an example controller for compensating for optical carrier variation.

FIG. 8 is a block diagram 800 of an example controller 820 for compensating for optical carrier variation. For example, controller 820 can be implemented in any controller configured to perform pre-compensation as discussed above, such as controller 120, 220, 420, and/or 520. The controller 820 includes an optical transmitter 824, which is substantially similar to optical transmitter 124. The controller 820 also includes a processor 821 coupled to the optical transmitter 824. The processor 821 may be any processing circuit configured to receive variation data 825 (e.g. variation data 125, 225, 425, and/or 525), for example from an electro-optical sensor via an O/E converter, and employ the variation data 825 to control the optical transmitter 824 to pre-compensate for optical carrier variation. For example, the processor 821 may employ the variation data to pre-compensate for optical carrier variation by employing method 1100 as discussed below. In other words, the processor 821 can increase and/or decrease power to the optical transmitter 824 to compensate for optical intensity increases and/or intensity decreases in the optical carrier as part of a feed-back loop.

Figure 9:
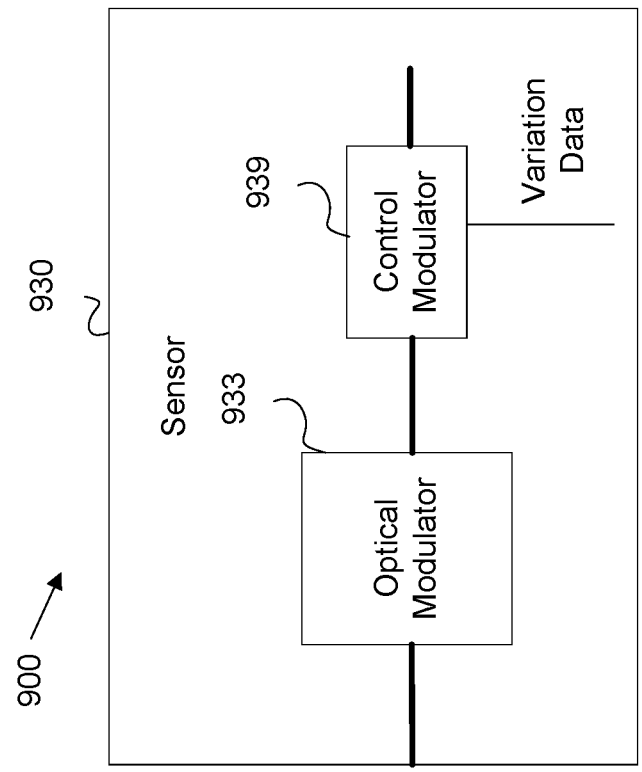
FIG. 9 is a block diagram of an example electro-optical sensor for compensating for optical carrier variation.

FIG. 9 is a block diagram 900 of an example electro-optical sensor 930 for compensating for optical carrier variation, such as electro-optical sensor 130, 230, 330, 430, and/or 530. The electro-optical sensor 930 includes an optical modulator 933, which may be substantially similar to optical modulator 133, 233, 333, 433, and/or 533. The electro-optical sensor 930 also includes a control modulator 939. The control modulator 939 is any optical modulator configured to increase and/or decrease optical intensity to the optical modulator 933 based on variation data. For example, when optical intensity increases/decreases, the control modulator 939 blocks/unblocks portions of the intensity based on variation data to cause the optical carrier to maintain a relatively constant optical intensity. As such, the control modulator 939 may be implemented as part of a compensation component. In this example, the control modulator is positioned between the optical input and the optical modulator 933, but in general the control modulator could be positioned elsewhere in the optical path. Further the control modulator 939 is configured to compensate for variation in the received optical carrier by maintaining a consistent optical carrier intensity incident to the optical modulator 933. In general, the control modulator could be positioned anywhere in the optical path and configured to compensate for variations in the optical carrier intensity incident to the optical modulator 933.

Figure 10:
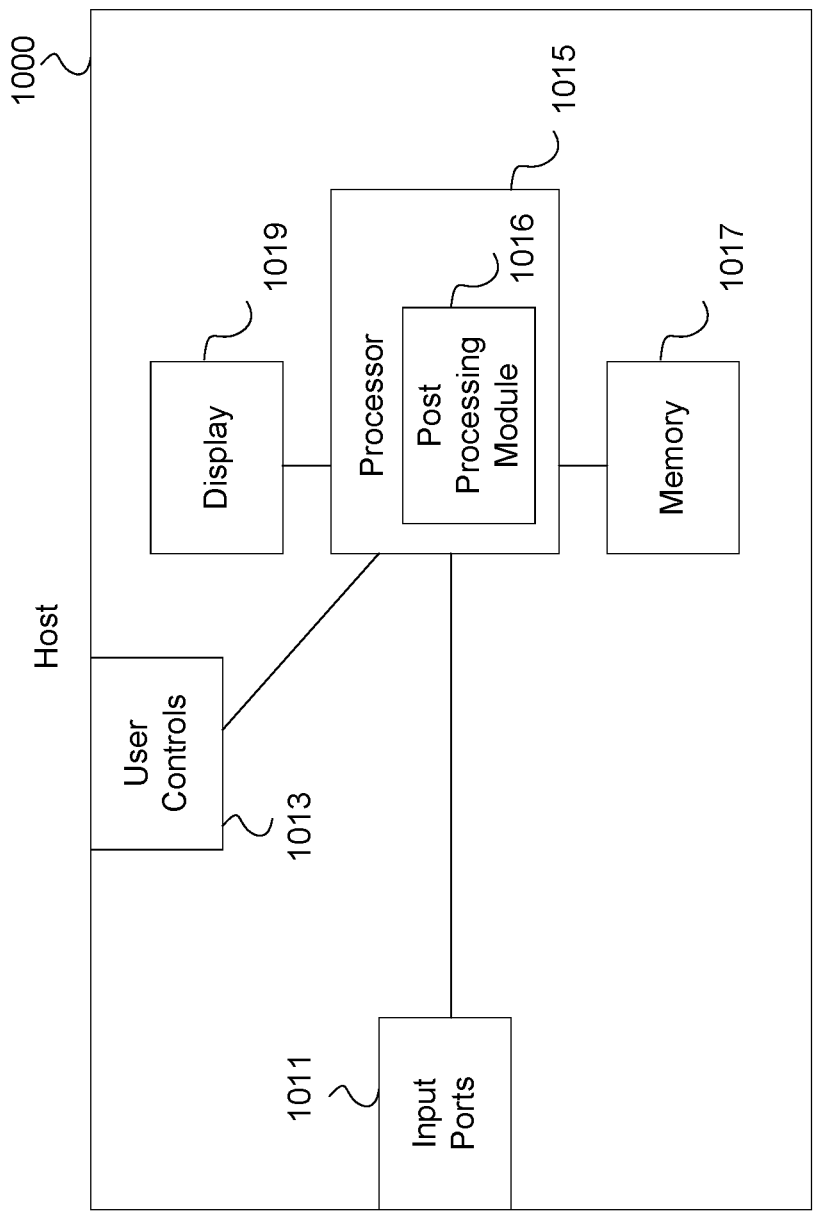
FIG. 10 is a block diagram of an example host for compensating for optical carrier variation.

FIG. 10 is a block diagram of an example host 1000 for compensating for optical carrier variation, such as host 110, 210, 310, 410, and/or 510. Host 1000 include an oscilloscope, and may be employed to perform post-compensation on transmission data carried in an optical signal based on determined variation in a corresponding optical carrier. Host 1000 may also be configured to implement method 1200 and/or any other method disclosed herein. Host 1000 comprises input ports 1011 which may be any electrical and/or optical ports, receivers, etc. configured to accept an input signal for testing purposes, such as a converted optical signal from a DUT via an electro-optical sensor and a controller. Input ports 1011 may be coupled to signal analysis circuits, which may comprise amplifiers, samplers, phase reference circuits, clock recovery circuits, and/or other components for signal sampling and/or signal conditioning. Such signal analysis circuits may be implemented as one or more application specific integrated circuits (ASICs), digital signal processor (DSPs), or other processing circuitry. The signal analysis circuits may also be configured to store input signal data to memory for further processing. The signal analysis circuits may be coupled to processor 1015, which may be implemented as a general purpose processor. The processor 1015 is configured to execute instructions from memory 1017 and perform any methods and/or associated steps indicated by the instructions. Memory 1017 may be implemented as processor cache, random access memory (RAM), read only memory (ROM), solid state memory, hard disk drive(s), or any other memory type. Memory 1017 acts as a non-transitory medium for storing data, computer program products, and other instructions, and providing such data/products/instruction to the processor 1015 for computation as needed.

The Processor 1015 may comprise a post processing module 1016. The post processing module 1016 is a processing circuit and/or set of instructions configured to employ received variation data to determine variation in an optical carrier and then compensate/remove such effects from transmission data carried in an optical signal generated from the optical carrier. The post processing module 1016 is further configured to perform method 1200 and/or any other method disclosed herein. In some embodiments, post processing module 1016 may also be implemented, in whole or in part, in the memory 1017, processor 1015, signal analysis circuits, user controls 1013, and/or display 1019.

User controls 1013 are coupled to the processor 1015. The user controls 1013 may comprise strobe inputs, gain controls, triggers, display adjustments, power controls, or any other controls employable by a user to display or alter a display of an input signal on display 1019. The display 1019 may be a digital screen or a cathode ray tube based display. The display 1019 may comprise a plurality of graticules for displaying corresponding input signals.

Figure 11:
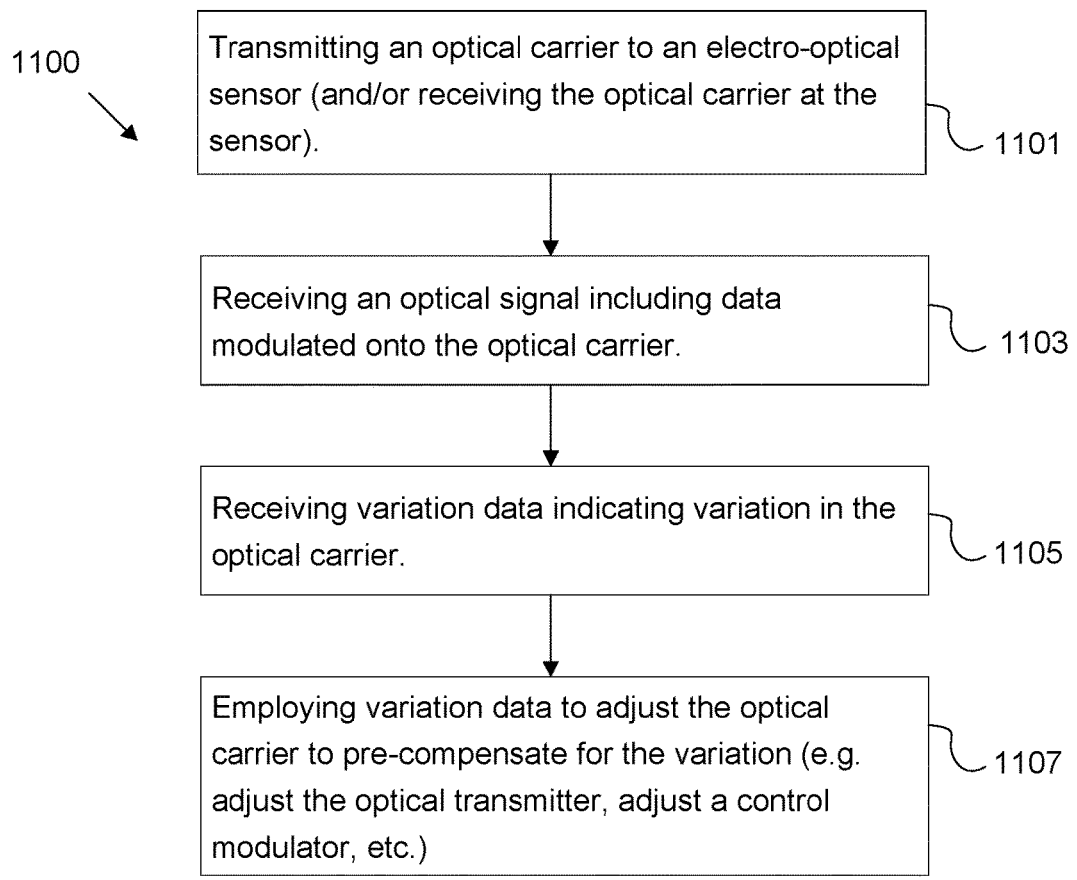
FIG. 11 is a flowchart of an example method for pre-compensating for optical carrier variation.

FIG. 11 is a flowchart of an example method 1100 for pre-compensating for optical carrier variation, for example in systems 100, 200, 300, 400, and/or 500. Method 1100 may be implemented in a controller, such as controller 820, and/or an electro-optical sensor, such as sensor 930. At block 1101, an optical carrier is transmitted to an electro-optical sensor for example for an optical transmitter. Further, the optical carrier is received at the electro-optical sensor. At block 1103, the optical signal from the electro-optical sensor is received at the controller. The optical signal received at the controller includes data modulated onto the optical carrier by the electro-optical sensor.

At block 1105, variation data is received at a compensation component. The variation data indicates variation in the optical carrier. In some aspects, the variation data is received at a compensation component in a controller, such as a processor controlling an optical transmitter in the controller or remotely controlling a control modulator in the electro-optical sensor. In other aspects, the variation data is received at a compensation component in the electro-optical sensor, such as a corrections unit, a bias control unit, and/or other logic circuit in the electro-optical sensor.

At block 1107, the variation data is employed to adjust the optical carrier to pre-compensate for the variation in the optical carrier, for example by employing a feedback loop. In some aspects, block 1107 is performed in the controller by adjusting the optical transmitter to maintain a consistent optical carrier intensity based on the variation data as part of a feedback control loop. In some aspects, block 1107 is performed in the controller by communicating with a control modulator in the electro-optical sensor to cause the control modulator to compensate for variation in the optical carrier at the electro-optical sensor prior to modulation into the optical signal. In some aspects, block 1107 is performed in the electro-optical sensor by a correction unit and/or a bias control unit acting as a compensation unit by varying the modulator to pre-compensate for variation in the optical carrier as part of a feedback loop.

Figure 12:
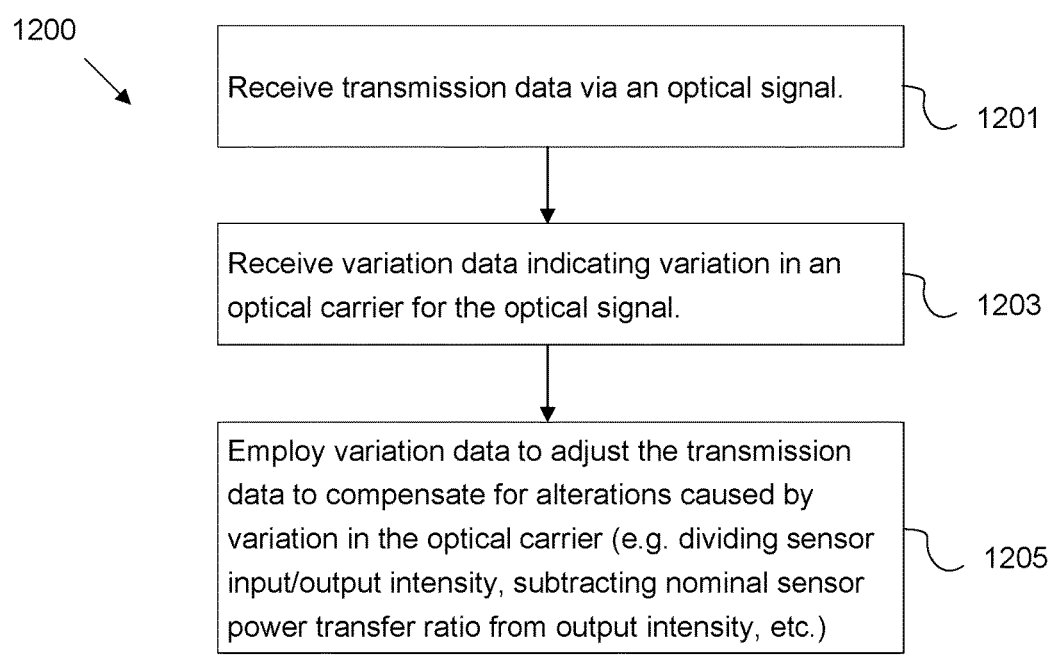
FIG. 12 is a flowchart of an example method for post compensating for optical carrier variation.

FIG. 12 is a flowchart of an example method 1200 for post compensating for optical carrier variation, for example as implemented in a host in systems 100, 200, 400, and/or 500. At block 1201, transmission data is received via an optical signal. For example, the transmission data may be carried by an optical signal and converted into an electrical signal by a controller before forwarding the transmission data to a host. At block 1203, variation data is also received. The variation data indicates variation in the optical carrier employed to carry the optical signal. At block 1205, the variation data is employed to adjust the transmission data to compensate for alterations to the transmission data caused by variation in the optical carrier. Multiple approaches may be employed to compensate for variation. In some aspects, a processor, ASIC, DSP, or other signal analysis circuit may compensate for variation by dividing a known output optical intensity of the remote electro-optical sensor by a known input optical intensity of the remote electro-optical sensor. Such division may be approximated in some aspects to reduce system complexity. Such division removes the mathematical terms related to the optical carrier variation from the data leaving only the intended transmission data with minimal artefacts from the optical carrier. In some aspects, a processor, ASIC, DSP, or other signal analysis circuit may compensate for variation by subtracting a nominal sensor power transfer ratio of the remote electro-optical sensor from an output optical intensity of the remote electro-optical sensor. For example, modulations of transmission data may operate in a relatively narrow range of the optical signal. Meanwhile optical signal variations may also occur in a relatively narrow range. Since the variations occur in a relatively narrow range, adjustments made by subtracting the nominal sensor power transfer has a relatively small effect on the transfer function of the sensor, while still reducing the noise related to the variations in the optical signal. By subtracting the nominal sensor power transfer ratio from the transmission data, a significant portion of the noise related to optical carrier variation is removed by a relatively simple mathematical process.

Aspects of the invention may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 includes an electro-optical sensor comprising: an optical input configured to receive an optical carrier via an upstream fiber; an optical modulator configured to modulate an electrical signal onto the optical carrier to create an optical signal; an optical output configured to transmit the optical signal via a downstream fiber; and a variation output configured to transmit variation data indicating variation in the received optical carrier to support compensation for corresponding variation in the optical signal.

Example 2 includes the subject matter of Example 1, and further comprising an optical splitter positioned between optical input and the optical modulator, the optical splitter configured to forward an un-modulated portion of the received optical carrier to the variation output as variation data.

Example 3 includes the subject matter of Examples 1-2, and further comprising an optical to electrical (O/E) converter positioned between the optical splitter and the variation output, the O/E converter configured to convert the un-modulated portion of the received optical carrier into electrical variation data.

Example 4 includes the subject matter of Examples 1-3, and wherein the optical modulator is polarization sensitive, and wherein the optical splitter is configured to forward portions of the optical carrier with polarization incompatible to the optical modulator as the un-modulated portion of the received optical carrier.

Example 5 includes the subject matter of Example 1, and wherein the optical modulator is a directional coupler with a first output coupled to the optical output and a second output coupled to the variation output, and wherein the optical output and the variation output each contain a portion of the optical signal and a portion of the variation data.

Example 6 includes the subject matter of Example 1, and wherein the optical output and the variation output are a common output coupled to the downstream fiber, and wherein the electro-optical sensor further comprises a radio frequency (RF) generator for generating an RF signal for modulation onto the optical carrier along with the electrical signal, the RF signal operating at a different frequency than the electrical signal and acting as variation data upon passing across the downstream fiber.

Example 7 includes an electro-optical sensor comprising: an optical input configured to receive an optical carrier via an upstream fiber; an optical modulator configured to modulate an electrical signal onto the optical carrier to create an optical signal; an optical output configured to transmit the optical signal via a downstream fiber; and a compensation component configured to compensate for variation in the received optical carrier to mitigate corresponding variation in the optical signal.

Example 8 includes the subject matter of Example 7, and wherein the compensation component includes a bias control unit configured to bias the optical modulator to compensate for variation in the received optical carrier.

Example 9 includes the subject matter of Example 7, and wherein the compensation component includes a control modulator positioned between the optical input and the optical modulator, the control modulator configured to compensate for variation in the received optical carrier by maintaining a consistent optical carrier intensity incident to the optical modulator.

Example 10 includes the subject matter of Examples 7-9, and further comprising an optical splitter positioned between optical input and the optical modulator, the optical splitter configured to forward an un-modulated portion of the received optical carrier to compensation component as variation data.

Example 11 includes the subject matter of Examples 7-10, and further comprising an optical to electrical (O/E) converter positioned between the optical splitter and the compensation component, the O/E converter configured to convert the un-modulated portion of the received optical carrier into electrical variation data for use by the compensation component.

Example 12 includes the subject matter of Examples 7-11, and wherein the optical modulator is polarization sensitive, and wherein the optical splitter configured to forward portions of the optical carrier with polarization incompatible to the optical modulator as the un-modulated portion of the received optical carrier.

Example 13 includes the subject matter of Examples 7-12, and wherein the optical splitter is a polarizing beam splitter with a primary axis aligned with the optical modulator and a secondary axis aligned with the O/E converter.

Example 14 includes a method comprising: transmitting, via an optical transmitter, an optical carrier to an electro-optical sensor; receiving an optical signal from the electro-optical sensor, the optical signal including data modulated onto the optical carrier; receiving variation data indicating variation in the optical carrier; and employing the variation data to adjust the optical carrier to pre-compensate for the variation in the optical carrier.

Example 15 includes the subject matter of Example 14, and wherein pre-compensating for the variation in the optical carrier includes adjusting the optical transmitter to maintain a consistent optical carrier intensity based on the variation data as part of a feedback control loop.

Example 16 includes the subject matter of Example 14, and wherein pre-compensating for the variation in the optical carrier includes communicating with a control modulator in the electro-optical sensor to cause the control modulator to compensate for variation in the optical carrier at the electro-optical sensor prior to modulation into the optical signal.

Example 17 includes a method comprising: receiving transmission data via an optical signal; receiving variation data indicating variation in an optical carrier employed to carry the optical signal; and employing the variation data to adjust the transmission data to compensate for alterations to the transmission data caused by variation in the optical carrier.

Example 18 includes the subject matter of Example 17, and wherein compensating for alterations to the transmission data includes dividing an output optical intensity of a remote electro-optical sensor by an input optical intensity of the remote electro-optical sensor.

Example 18 includes the subject matter of Example 17, and wherein compensating for alterations to the transmission data includes approximating a division of an output optical intensity of a remote electro-optical sensor by an input optical intensity of the remote electro-optical sensor.

Example 20 includes the subject matter of Example 17, and wherein compensating for alterations to the transmission data includes subtracting a nominal sensor power transfer ratio of a remote electro-optical sensor from an output optical intensity of the remote electro-optical sensor.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Although specific aspects of the invention have been illustrated and described for purposes of illustration, it will be understood that various modifications may be made without departing from the spirit and scope of the invention. Accordingly, the invention should not be limited except as by the appended claims.

We claim:

1. An electro-optical sensor comprising:
   an optical input configured to receive an optical carrier via an upstream fiber;
   an optical modulator configured to modulate an electrical signal onto the optical carrier to create an optical signal;
   an optical output configured to transmit the optical signal via a downstream fiber;
   a variation output configured to transmit variation data indicating variation in the received optical carrier to support compensation for corresponding variation in the optical signal; and
   an optical splitter integrated with the optical modulator or positioned between the optical input and the optical modulator, the optical splitter configured to forward the un-modulated portion of the received optical carrier to the variation output as variation data.

2. The electro-optical sensor of claim 1, further comprising an optical to electrical (O/E) converter positioned between the optical splitter and the variation output, the O/E converter configured to convert the un-modulated portion of the received optical carrier into electrical variation data.

3. The electro-optical sensor of claim 1, wherein the optical modulator is polarization sensitive, and wherein the optical splitter is configured to forward portions of the optical carrier with polarization incompatible to the optical modulator as the un-modulated portion of the received optical carrier.

4. An electro-optical sensor comprising:
   an optical input configured to receive an optical carrier via an upstream fiber;
   an optical modulator configured to modulate an electrical signal onto the optical carrier to create an optical signal;
   an optical output configured to transmit the optical signal via a downstream fiber; and
   a variation output configured to transmit variation data indicating variation in the received optical carrier to support compensation for corresponding variation in the optical signal,
   wherein the optical modulator is a directional coupler with a first output coupled to the optical output and a second output coupled to the variation output, and wherein the optical output and the variation output each contain a portion of the optical signal and a portion of the variation data.

5. An electro-optical sensor comprising:
   an optical input configured to receive an optical carrier via an upstream fiber;
   an optical modulator configured to modulate an electrical signal onto the optical carrier to create an optical signal;
   an optical output configured to transmit the optical signal via a downstream fiber; and
   a variation output configured to transmit variation data indicating variation in the received optical carrier to support compensation for corresponding variation in the optical signal,
   wherein the optical output and the variation output are a common output coupled to the downstream fiber, and wherein the electro-optical sensor further comprises a radio frequency (RF) generator for generating an RF signal for modulation onto the optical carrier along with the electrical signal, the RF signal operating at a different frequency than the electrical signal and acting as variation data upon passing across the downstream fiber.

6. An electro-optical sensor comprising:

an optical input configured to receive an optical carrier via an upstream fiber;

an optical modulator configured to modulate an electrical signal onto the optical carrier to create an optical signal;

an optical output configured to transmit the optical signal via a downstream fiber;

a compensation component configured to compensate for variation in the received optical carrier to mitigate corresponding variation in the optical signal; and an optical splitter integrated with the optical modulator or positioned between the optical input and the optical modulator, the optical splitter configured to forward an un-modulated portion of the received optical carrier to the compensation component as variation data.

7. The electro-optical sensor of claim 6, wherein the compensation component includes a bias control unit configured to bias the optical modulator to compensate for variation in the received optical carrier.

8. The electro-optical sensor of claim 6, wherein the compensation component includes a control modulator positioned between the optical input and the optical modulator, the control modulator configured to compensate for variation in the received optical carrier by maintaining a consistent optical carrier intensity incident to the optical modulator.

9. The electro-optical sensor of claim 6, further comprising an optical to electrical (O/E) converter positioned between the optical splitter and the compensation component, the O/E converter configured to convert the un-modulated portion of the received optical carrier into electrical variation data for use by the compensation component.

10. The electro-optical sensor of claim 9, wherein the optical modulator is polarization sensitive, and wherein the optical splitter is configured to forward portions of the optical carrier with polarization incompatible to the optical modulator as the un-modulated portion of the received optical carrier.

11. The electro-optical sensor of claim 10, wherein the optical splitter is a polarizing beam splitter with a primary axis aligned with the optical modulator and a secondary axis aligned with the O/E converter.

* * * * *